US008635517B2

(12) United States Patent
Abu-Surra et al.

(10) Patent No.: US 8,635,517 B2
(45) Date of Patent: Jan. 21, 2014

(54) METHODS AND APPARATUS FOR FAST SYNCHRONIZATION USING QUASI-CYCLIC LOW-DENSITY PARITY-CHECK (QC-LDPC) CODES

(75) Inventors: Shadi Abu-Surra, Richardson, TX (US); Zhouyue Pi, Allen, TX (US)

(73) Assignee: Samsung Electronics Co., Ltd., Suwon-Si (KR)

( * ) Notice: Subject to any disclaimer, the term of this patent is extended or adjusted under 35 U.S.C. 154(b) by 173 days.

(21) Appl. No.: 13/360,228

(22) Filed: Jan. 27, 2012

(65) Prior Publication Data

US 2012/0198305 A1   Aug. 2, 2012

Related U.S. Application Data (60) Provisional application No. 61/438,087, filed on Jan. 31, 2011.

(51) Int. Cl.
*G06F 11/00* (2006.01)
*H03M 13/00* (2006.01)

(52) U.S. Cl.
USPC .......................................... 714/798; 714/800

(58) Field of Classification Search
USPC .................. 714/746, 758, 775, 789, 798, 800
See application file for complete search history.

(56) References Cited

U.S. PATENT DOCUMENTS

| 2009/0049357 A1 | 2/2009 | Ueng et al. |
| 2010/0100788 A1 | 4/2010 | Yang et al. |
| 2010/0162074 A1 | 6/2010 | Oh et al. |
| 2012/0320994 A1* | 12/2012 | Loghin et al. ............ 375/240.27 |

FOREIGN PATENT DOCUMENTS

KR  2008-0052832  6/2008

OTHER PUBLICATIONS

Kaiser et al., Undetected errors in Quasi-cyclic LDPC codes caused by receiver symbol slips, 2009, IEEE, p. 1-6.*
International Search Report dated Sep. 26, 2012 in connection with International Patent Application No. PCT/KR2012/000740.
Written Opinion of International Searching Authority dated Sep. 26, 2012 in connection with International Patent Application No. PCT/KR2012/000740.

* cited by examiner

*Primary Examiner* — Shelly A Chase (57) ABSTRACT

For use in a wireless communication network, a transmitter is configured to encode information. The transmitter includes a cyclic redundancy check (CRC) encoder configured to encode a physical broadcast channel (PBCH) message using a cyclic redundancy check. The transmitter also includes a timing dependent cyclic shift block configured to encode information in the PBCH message. The transmitter further includes a quasi-cyclic low-density parity-check (QC-LDPC) encoder configured to encode the PBCH message using a QC-LDPC.

22 Claims, 8 Drawing Sheets

METHODS AND APPARATUS FOR FAST SYNCHRONIZATION USING QUASI-CYCLIC LOW-DENSITY PARITY-CHECK (QC-LDPC) CODES

CROSS-REFERENCE TO RELATED APPLICATION(S) AND CLAIM OF PRIORITY

The present application is related to U.S. Provisional Patent Application No. 61/438,087, filed Jan. 31, 2011, entitled "METHODS AND APPARATUS FOR FAST SYNCHRONIZATION USING QC-LDPC CODES". Provisional Patent Application No. 61/438,087 is assigned to the assignee of the present application and is hereby incorporated by reference into the present application as if fully set forth herein. The present application hereby claims priority under 35 U.S.C. §119(e) to U.S. Provisional Patent Application No. 61/438,087.

The present application is also related to U.S. patent application Ser. No. 13/081,355, filed Apr. 6, 2011, entitled "METHODS AND APPARATUS FOR FAST SYNCHRONIZATION USING TAIL BITING CONVOLUTIONAL CODES". patent application Ser. No. 13/081,355 is assigned to the assignee of the present application and is hereby incorporated by reference into the present application as if fully set forth herein.

TECHNICAL FIELD OF THE INVENTION

The present application relates generally to wireless communication and, more specifically, to uses of quasi-cyclic low-density parity-check (QC-LDPC) codes to encode control messages in wireless communication.

BACKGROUND OF THE INVENTION

3GPP Long Term Evolution (LTE) is a recent standard in mobile communication technology. 3GPP LTE is a project of the 3rd Generation Partnership Project (3GPP).

Time synchronization is one of the first steps in establishing communication between two devices. Existing wireless communication systems, including WiFi, CDMA/CDMA2000/1xEV-DO, GSM/WCDMA/HSPA, mobile WiMAX, and LTE/LTE-Advanced systems, all have carefully designed time synchronization signals and procedures. For example, in an LTE system, the primary synchronization signal (PSS) and secondary synchronization signal (SSS) may be used to allow the mobile station (or user equipment or UE) to synchronize to the timing of the base station. A frame boundary can be detected via a physical broadcast channel (PBCH).

SUMMARY OF THE INVENTION

For use in a wireless network, a transmitter configured to encode information is provided. The transmitter includes a cyclic redundancy check (CRC) encoder configured to encode a physical broadcast channel (PBCH) message using a cyclic redundancy check. The transmitter also includes a timing dependent cyclic shift block configured to encode information in the PBCH message. The transmitter further includes a quasi-cyclic low-density parity-check (QC-LDPC) encoder configured to encode the PBCH message using a QC-LDPC.

A method of encoding information at a transmitter is provided. The method includes encoding a PBCH message using a CRC. The method also includes encoding information in the PBCH message. The method further includes encoding the PBCH message using a QC-LDPC code.

For use in a wireless communication network, a method of detecting frame timing at a receiver is provided. The method includes receiving code symbols of a PBCH in a message. The method also includes decoding the received code symbols using a QC-LDPC code. The method further includes examining the QC-LDPC-decoded symbols for a CRC. The method still further includes $m_b$-sectionized cyclically shifting the QC-LDPC-decoded symbols, and determining a current frame number based on a number of times the QC-LDPC-decoded symbols are cyclically shifted.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

FIGS. 1 through 8, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged wireless communication system.

The following documents and standards descriptions are hereby incorporated into the present disclosure as if fully set forth herein:

3GPP Technical Specification No. 36.211, v9.1.0, "Evolved Universal Terrestrial Radio Access (E-UTRA); Physical channels and modulation"; and 3GPP Technical Specification No. 36.212, v9.1.0, "Evolved Universal Terrestrial Radio Access (E-UTRA); Multiplexing and channel coding".

Time synchronization is one of the first steps in establishing communication between two devices. Existing wireless communication systems, including WiFi, CDMA/CDMA2000/1xEV-DO, GSM/WCDMA/HSPA, mobile WiMAX, and LTE/LTE-Advanced systems, all have carefully designed time synchronization signals and procedures.

Figure 1:
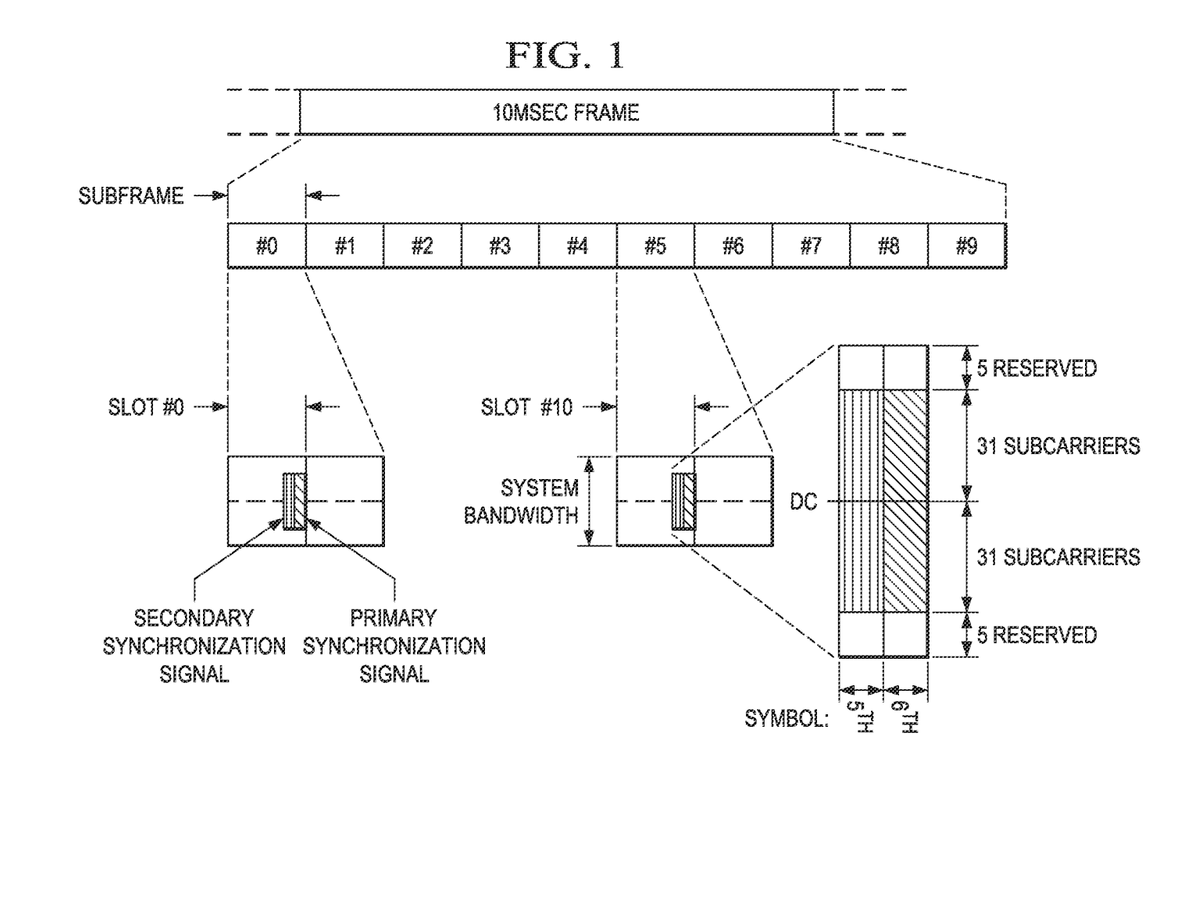
FIG. 1 illustrates synchronization signals in a LTE system.

For example, FIG. 1 illustrates synchronization signals in an LTE system. As shown in FIG. 1, the primary synchronization signal (PSS) and secondary synchronization signal (SSS) may be used to allow the mobile station (or user equipment or UE) to synchronize to the timing of the base station.

The PSS and SSS are transmitted in both subframe #0 and subframe #5 in every 10 ms frame. In each occurrence, both the PSS and the SSS occupy the center 62 subcarriers (with five (5) subcarriers on each side reserved).

There are 504 unique physical-layer cell identities. The physical-layer cell identities are grouped into 168 unique physical-layer cell-identity groups, each group containing three unique identities. The grouping is such that each physical-layer cell identity is part of one and only one physical-layer cell-identity group. A physical-layer cell identity $N_{ID}^{cell}=3N_{ID}^{(1)}+N_{ID}^{(2)}$ is thus uniquely defined by a number $N_{ID}^{(1)}$ in the range of 0 to 167, representing the physical-layer cell-identity group; and a number $N_{ID}^{(2)}$ in the range of 0 to 2, representing the physical-layer identity within the physical-layer cell-identity group. The information of $N_{ID}^{(2)}$ is carried in the PSS while the information of $N_{ID}^{(1)}$ is carried in the SSS.

The sequence used for the PSS is generated from a frequency-domain Zadoff-Chu sequence. The Zadoff-Chu root sequence index is linked to $N_{ID}^{(2)}$, which allows the UEs to detect the value of $N_{ID}^{(2)}$ by detecting the PSS. The UEs are able to detect the 5 ms timing by detecting the PSS, because the PSS is transmitted periodically every 5 ms.

The sequence used for the SSS is an interleaved concatenation of two binary sequences, each having a length of thirty-one (31). The concatenated sequence is scrambled with a scrambling sequence given by the PSS. The combination of two thirty-one-length sequences defining the SSS differs between subframe 0 and subframe 5 in order for the UEs to detect the 10 ms frame timing. The choice of the two thirty-one-length binary sequences is linked to the physical-layer cell-identity group $N_{ID}^{(1)}$, which allows the UEs to detect the value of the physical-layer cell-identity group $N_{ID}^{(1)}$ by detecting the SSS.

Figure 2:
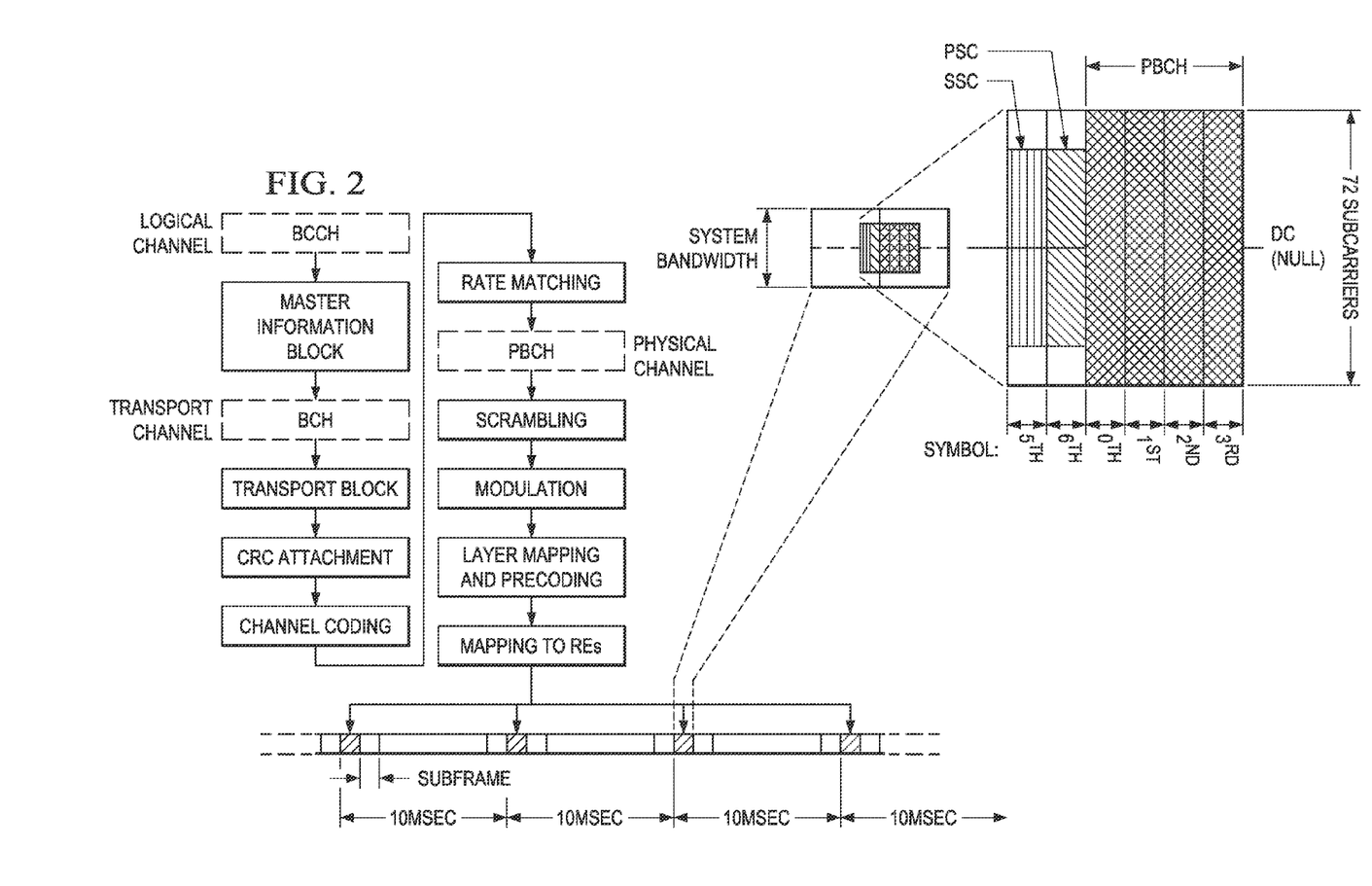
FIG. 2 illustrates a PBCH in LTE systems.

Additionally, the frame boundary and the starting position of the 40 ms (four frames) boundary can be detected via a physical broadcast channel (PBCH). For example, FIG. 2 illustrates a PBCH in LTE systems. As shown in FIG. 2, a PBCH transport block is transmitted in subframe 0 of the four (4) consecutive frames in a 40 ms interval. The PBCH signal is scrambled with a scrambling sequence that is initialized every 40 ms by the cell ID in the first subframe of a frame with a system frame number (SFN) that is a multiple of four (4). This design enables the UEs to detect the 40 ms timing by detecting the PBCH.

For a vector $V=(v_0, v_1, \ldots, v_{n-1})$, the vector $V^{(1)}=(v_{n-1}, v_0, v_1, \ldots, v_{n-2})$ is called a cyclic shift of V. A (n, k) linear block code $C_1$ is said to be cyclic if the cyclic shift of any codeword in $C_1$ is also a codeword in $C_1$. BCH codes, Reed-Solomon codes, Hamming codes, and tail-biting convolutional codes are examples of cyclic codes.

Moreover, given two positive integers Z and $n_b$, a $(Z*n_b, k)$ linear block code $C_2$ is called an $n_b$-section quasi-cyclic code if the cyclic shift of every Z-bit section of any codeword in $C_2$ is also a codeword in $C_2$. For example, if $V=(v_1, v_2, \ldots, v_{nb})$, where $V_i=(v_0, v_1, \ldots, v_{Z-1})$ is a codeword in $C_2$, then the $n_b$-sectionized cyclic shift $(v_1^{(1)}, v_2^{(1)}, \ldots, v_{nb}^{(1)})$ is also a codeword in $C_2$. LDPC codes found in IEEE 802.16e, IEEE 802.11n, and WiGig are all examples on quasi-cyclic codes. It is noted that a cyclic code is a special quasi-cyclic code with $n_b=1$.

This disclosure describes a method for embedding information (e.g., frame timing information) as a cyclic shift of codewords in a cyclic code, or as a sectionized cyclic shift of codewords in a quasi-cyclic code. The information part of the codeword carries CRC, which can be used at the receiver to blindly decode the imbedded information.

Figure 3:
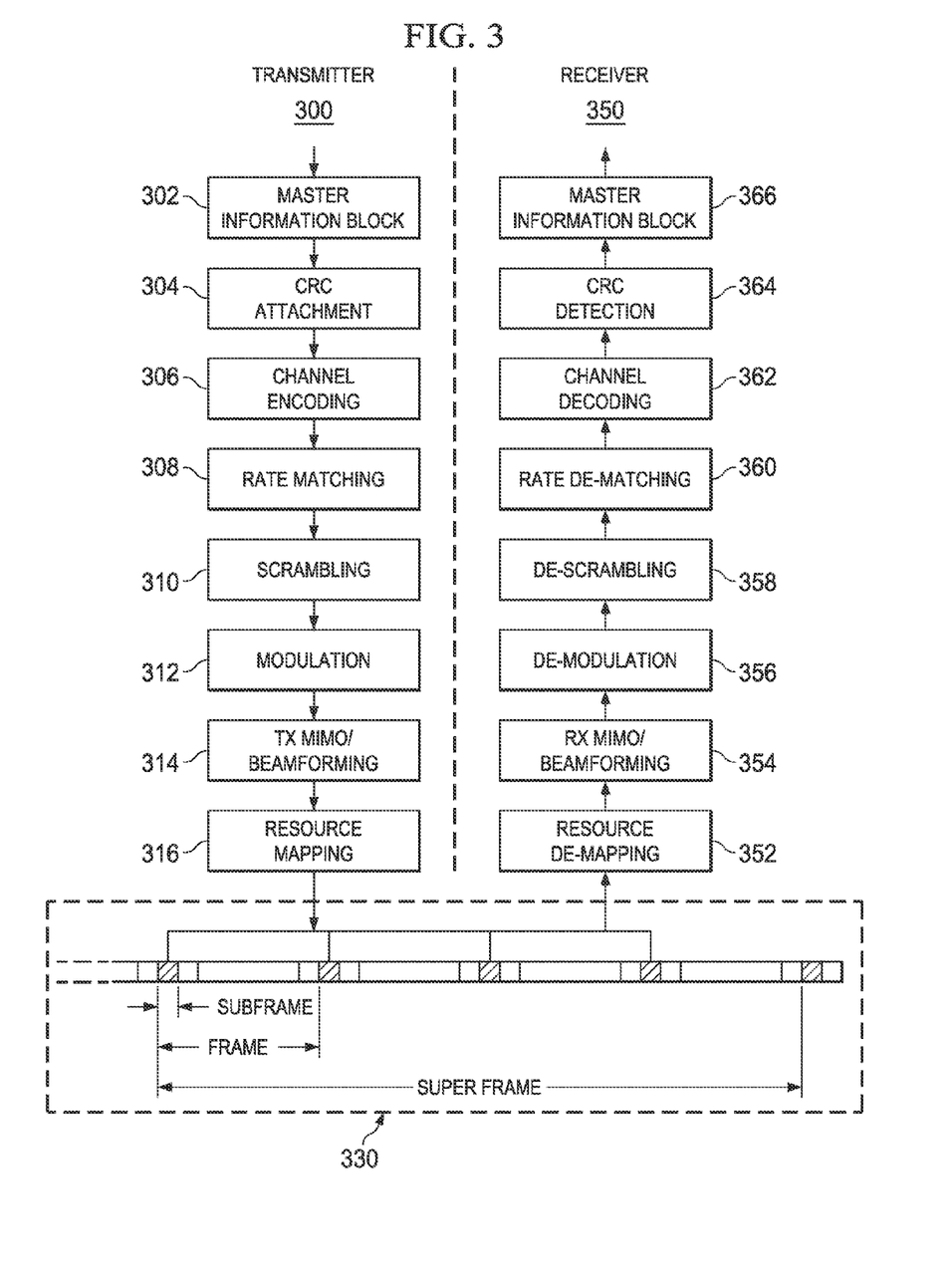
FIG. 3 illustrates a PBCH transmitter and receiver for use in a LTE or LTE-A system.

FIG. 3 illustrates a PBCH transmitter and receiver for use in a LTE or LTE-A system. In the transmitter 300, the Master Information Block (MIB) 302 carries fundamental system information such as downlink system bandwidth and the system frame number (SFN). After cyclic redundancy check (CRC) attachment 304, channel encoding 306, rate matching 308, scrambling 310, modulation 312, and transmission MIMO/beamforming processing 314, the modulation symbols are mapped in a resource mapping block 316 to resource elements allocated for PBCH. The modulation symbols are then transmitted.

The receiver 350 receives the transmitted symbols and processes the symbols by resource de-mapping 352, reception MIMO/beamforming processing 354, de-modulation 356, de-scrambling 358, rate de-matching 360, channel decoding 362, CRC detection 364, and extraction of the MIB 366.

In order to ensure high reliability of PBCH (and thus MIB) reception, each MIB is transmitted across four (4) consecutive frames 330. In each frame, the PBCH (and thus the MIB) is transmitted in the first subframe. The SFN field in the MIB does not carrier the last two bits of the SFN. In order to facilitate the UE to detect the 40 ms timing, the transmission of the PBCH in each frame is scrambled differently. This is achieved by initializing the scrambling sequence generator by the cell ID once every 40 ms. As a result, the scrambling sequence applied to PBCH transmission in each of the four (4) subframes within a 40 ms interval is different.

When the receiver 350 receives a PBCH transmission in a subframe, the receiver 350 blindly detects the 40 ms timing (i.e., which one of the four (4) frames within the 40 ms interval the current subframe belongs to) by attempting decoding of the PBCH assuming different hypotheses of the frame number. In each hypothesis, the receiver 350 descrambles the PBCH transmission differently and attempts the decoding. In addition, to increase the reliability, the receiver 350 may combine with previous PBCH transmissions, which also utilizes different descrambling of previous PBCH transmissions for different hypotheses. As a result, this can lead to significant complexity in the 40 ms timing acquisition using a PBCH.

In accordance with embodiments of the present disclosure, fast timing synchronization in a mobile broadband system may be achieved by using cyclic shifts of quasi-cyclic codes, and in particular, quasi-cyclic low-density parity-check (QC-LDPC) codes.

Embodiments of the present disclosure are described using an $n_b$-section quasi-cyclic ($Z*n_b$, $Z*m_b$) LDPC code $C_2$, where any codeword in $C_2$ includes $n_b$ sections, each of length $Z$ bits. However, it will be understood that other quasi-cyclic linear block codes are within the scope of this disclosure.

As used herein, for a vector with y sections, each of length $Z$ bits, "y-sectionized cyclic shift" refers to cyclically shifting each of the vector's y sections by one position to the right. Similarly, "y-sectionized cyclic shift by x number of times" refers to cyclically shifting each of the vector's y sections by x positions to the right.

For the purpose of illustration, the embodiments are described in the context of time synchronization for LTE systems. However, it will be understood that the embodiments are applicable to time or frequency synchronization in other wireless communication systems, including 4G, beyond 4G, and 5G mobile broadband systems.

Figure 4:
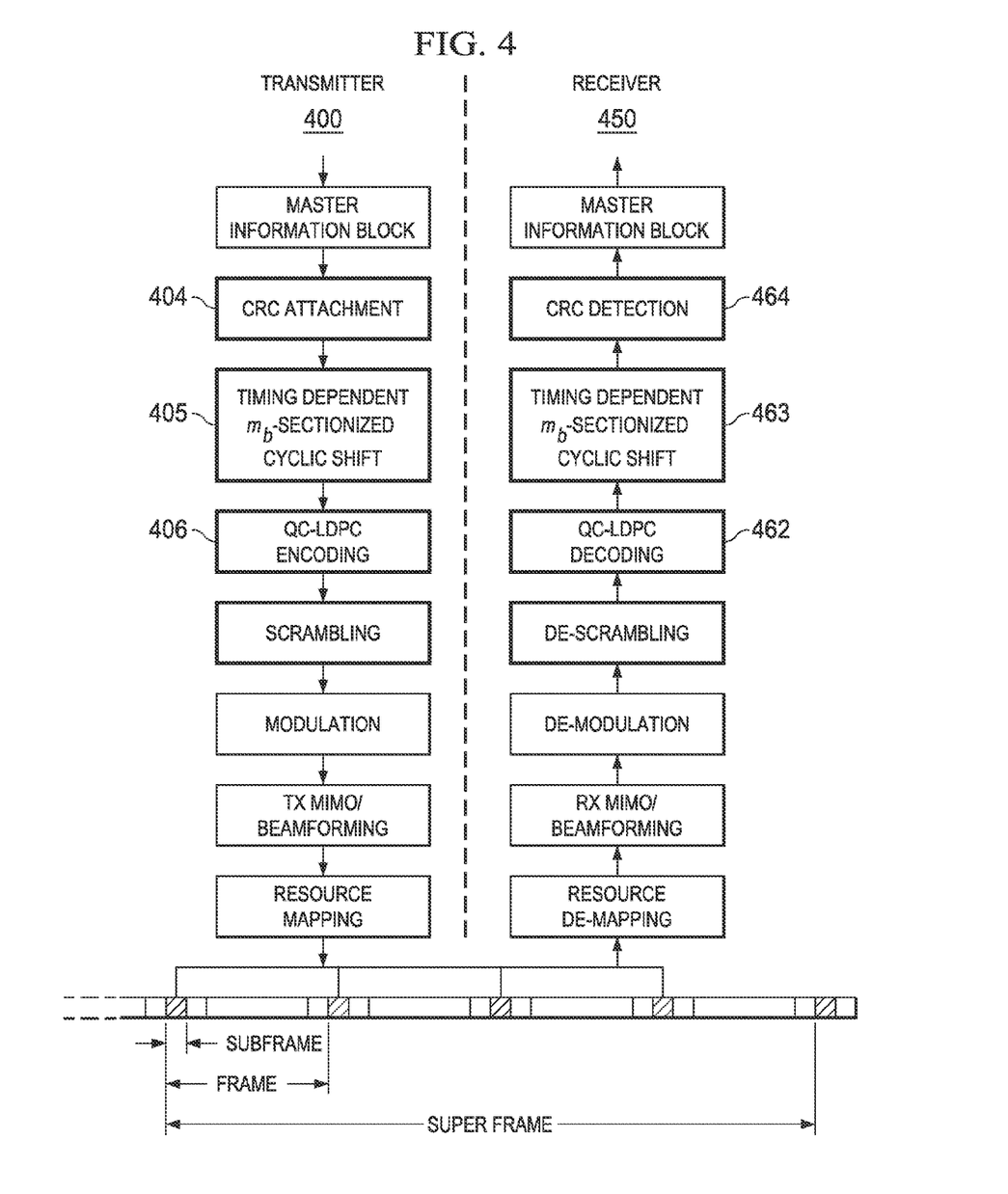
FIG. 4 illustrates a process for encoding frame timing information using QC-LDPC coding, according to one embodiment of the present disclosure.

FIG. 4 illustrates a process for encoding frame timing information using QC-LDPC coding, according to one embodiment of the present disclosure. As shown in FIG. 4, the transmitter 400 and receiver 450 include many of the same or similar elements as the transmitter 300 and receiver 350 in FIG. 3. Descriptions of these elements are omitted for ease of explanation. The transmitter 400 also includes a CRC attachment block 404, a timing dependent $m_b$-sectionized cyclic shift block 405, and a QC-LDPC encoding block 406. The receiver 450 includes a QC-LDPC decoding block 462, a timing $m_b$-sectionized dependent cyclic shift block 463, and a CRC detection block 464.

In the embodiment shown in FIG. 4, the frame timing information (e.g., the last two bits of the SFN) of a frame is encoded in the PBCH transmission in the frame by $m_b$-sectionized cyclically shifting the PBCH message a number of times. The number of cyclic shifts is determined by the frame timing information. After the message in the MIB is encoded in CRC attachment block 404 and padded with zeros to form a vector of length $k=Z*m_b$ bits, the message is $m_b$-sectionized cyclically shifted in the $m_b$-sectionized cyclic shift block 405 by a number of times that equals the last two bits of the SFN. The $m_b$-sectionized cyclically shifted message then goes through the QC-LDPC encoding block 406, then scrambling, modulation, transmission MIMO processing, and resource mapping. The receiver 450 then transmits the message.

Preferably, in order to simplify the complexity of the receiver 450, the other procedures in the PBCH transmission chain 400 (including the QC-LDPC encoding block 406, scrambling, modulation, Tx MIMO processing, and resource mapping) should not depend on the last two bits of the SFN. For example, in an embodiment, the scrambling sequence generator may be initialized every frame, instead of every four (4) frames.

Upon receiving a PBCH transmission, the receiver 450 may attempt decoding of the PBCH with different hypotheses of the 40 ms frame timing (i.e., by attempting different values of the two least significant bits (LSBs) of the SFN). Since the scrambling sequence generator is initialized by the cell ID in each frame, the same scrambling sequence is used to scramble the PBCH transmission in each frame. The receiver 450 does not need the 40 ms frame timing information to properly descramble the received symbols. After de-scrambling, the receiver 450 may combine PBCH transmissions across frames by properly $n_b$-sectionized cyclically shifting the received coded symbols in these frames, without explicitly knowing the value of the last two LSBs of the SFN for the current frame. This method significantly reduces the complexity of the receiver 450 in applying different scrambling or blind decoding of the PBCH transmissions.

As an example, it will be assumed that the MIB is twenty-four (24) bits long, the CRC is sixteen (16) bits long, and the encoder is (384, 48) QC-LDPC code with $Z=24$. The MIB message is denoted as $a_0, a_1, a_2, a_3, \ldots, a_{A-1}$, and the CRC is denoted as $p_0, p_1, p_2, p_3, \ldots, p_{L-1}$. After the CRC attachment and padding by 8 zeros, the CRC and the padded bits may be additionally scrambled with the sequence $x_0, x_1, \ldots, x_{23}$ to form the sequence of bits $c_0, c_1, c_2, c_3, \ldots, c_{K-1}$ where $c_k = a_k$ for $k=0, 1, 2, \ldots, A-1$
$c_k = p_{k-A} \oplus x_{k-A}$ for $k=A, A+1, A+2, \ldots, A+15$
$c_k = x_{k-A}$ for $k=A+16, A+17, \ldots, A+23$.

The additional scrambling of the CRC may be used to carry information such as the base station transmit antenna configuration by using a different CRC scrambling sequence for each base station transmit antenna configuration. In order to avoid an all-zero message after scrambling, the scrambling sequence preferably should not be all zeros. In an embodiment, a non-zero scrambling sequence may be applied in addition to the scrambling sequences that are used to carry information. In another embodiment, all scrambling sequences that are used to carry information are non-zero. It is noted that a non-zero scrambling sequence is a scrambling sequence that has at least one bit that is non-zero. Similarly, in order to avoid an all-ones message after scrambling, the scrambling sequence preferably should not be all ones.

For a PBCH transmission in a frame with the two LSBs equal to '00', no cyclic shift is applied to the message $C_0, C_1, C_2, C_3, \ldots, c_{K-1}$. For a PBCH transmission in a frame with the two LSBs equal to '01', the message $c_0, c_1, c_2, c_3, \ldots, c_{K-1}$ is 2-sectionized cyclically shifted by 1 bit. The resulting message is $c_{Z-1}, c_0, c_1, \ldots, c_{K-1}, c_Z, c_{Z+1}, \ldots, c_{K-2}$.

As shown in FIG. 4, the cyclically shifted message is then encoded at the QC-LDPC encoding block 406 and processed by other steps in the transmitter chain 400 as shown.

Turning now to the receiver 450, because the resource de-mapping, Rx MIMO processing, de-modulation, de-scrambling, and decoding are independent of the value of the 40 ms frame timing (i.e., the two LSBs of the SFN), the receiver 450 may proceed with these steps without the information of the frame timing. Once the decoding is complete, the receiver 450 proceeds with CRC detection assuming different values of cyclic shift. The receiver 450 uses the CRC to detect which hypothesis of the value of the cyclic shift is correct (and thus detect the value of the two LSBs of the SFN in the 40 ms frame timing). With this method, the receiver 450 only needs to attempt descrambling and QC-LDPC decoding once per frame. The blind detection of the 40 ms frame timing is achieved by attempting CRC detection with multiple hypotheses of cyclic shift.

Figure 5:
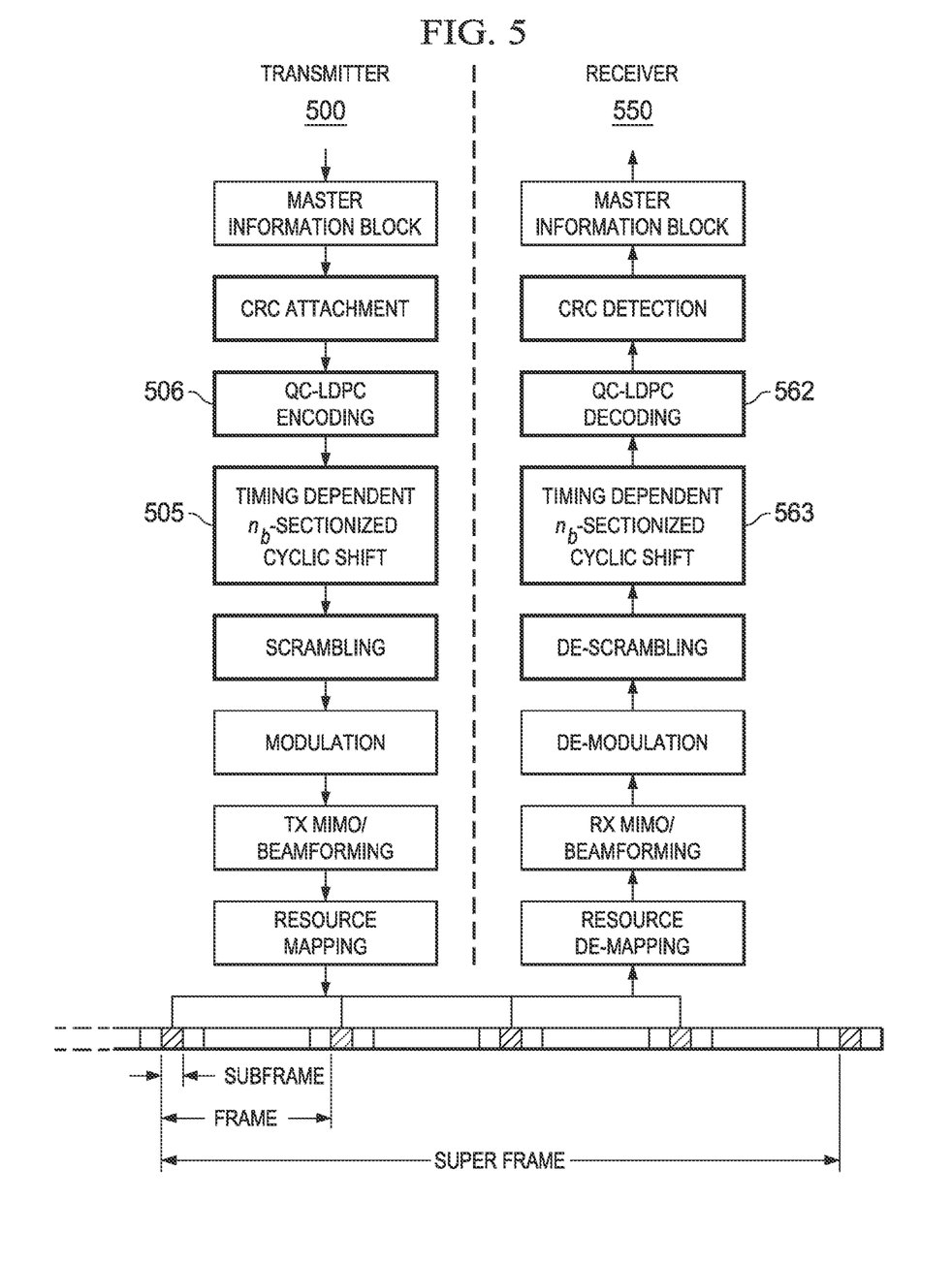
FIG. 5 illustrates a process for encoding frame timing information using a cyclic shift after QC-LDPC encoding, according to an embodiment of the present disclosure.

The timing dependant cyclic shift of the message may be implemented in different ways or at different times. For example, FIG. 5 illustrates a process for encoding frame timing information using a cyclic shift after QC-LDPC encoding, according to an embodiment of the present disclosure. As shown in FIG. 5, the transmitter 500 and receiver 550 include the same or similar elements as the transmitter 400 and receiver 450 in FIG. 4. Descriptions of these elements are omitted for ease of explanation. In the transmitter 500, the timing dependent $n_b$-sectionized cyclic shift block 505 and the QC-LDPC encoding block 506 have switched order as compared to FIG. 4. Likewise, in the receiver 550, the QC- LDPC decoding block 562 and the timing dependent $n_b$-sectionized cyclic shift block 563 have switched order.

Though the order of operations in FIG. 5 is different than in FIG. 4, the resulting transmission is equivalent. For example, the transmitter 400 of FIG. 4 performs $m_b$-sectionized cyclic shift by x times on a message (using timing dependent $n_b$-sectionized cyclic shift block 405), then encodes with the QC-LDPC encoder 406 to produce a sequence $S_1$. Similarly, the transmitter 500 of FIG. 5 encodes the message with the QC-LDPC encoder 506, then performs $n_b$-sectionized cyclic shift by x times to produce a sequence $S_2$, where $S_1$ is equivalent to $S_2$.

Figure 6:
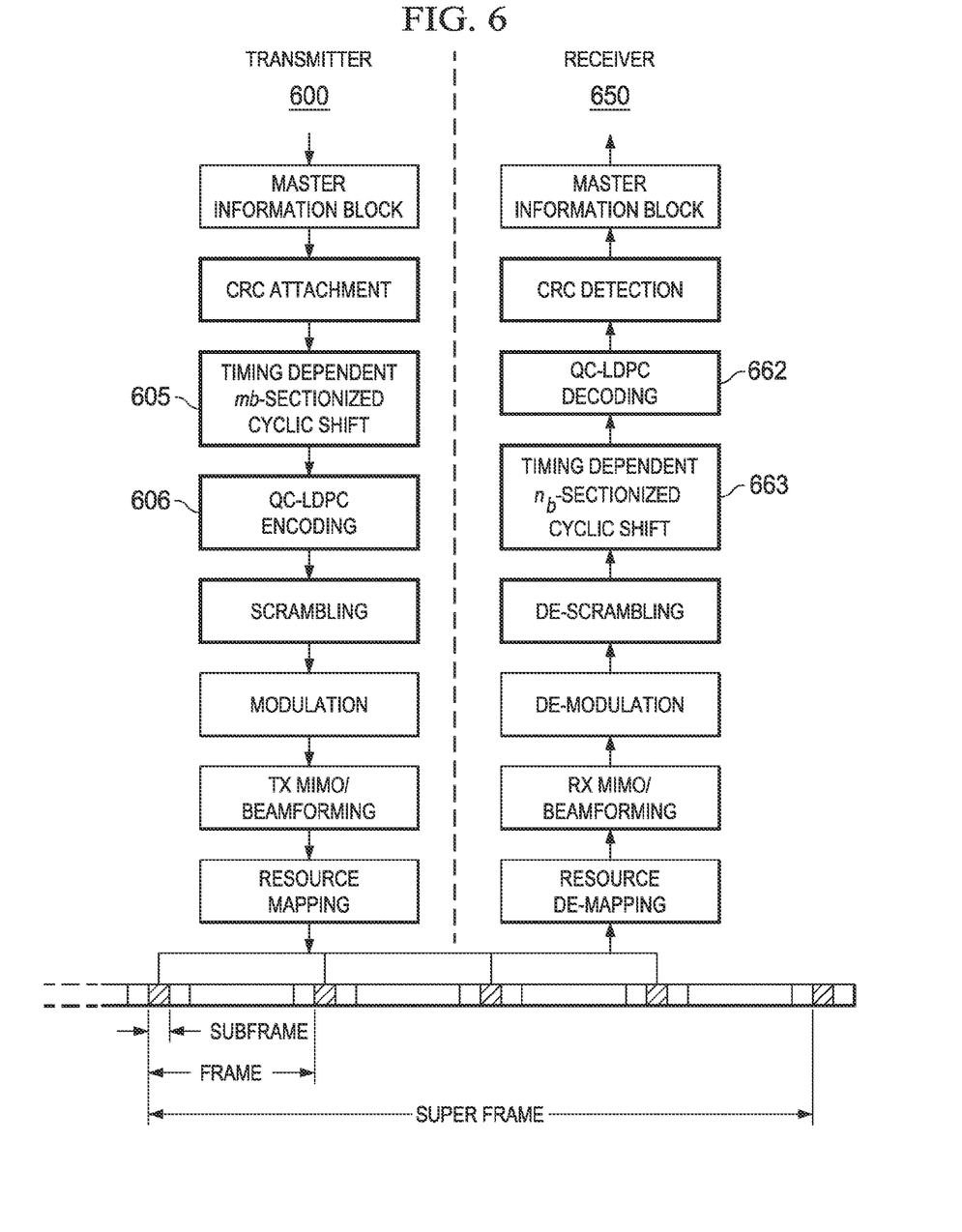
FIG. 6 illustrates a process for encoding frame timing information using a cyclic shift before QC-LDPC encoding, according to an embodiment of the present disclosure.

As another example, FIG. 6 illustrates a process for encoding frame timing information using a cyclic shift before QC-LDPC encoding, according to an embodiment of the present disclosure. As shown in FIG. 6, the transmitter 600 and receiver 650 include the same or similar elements as the transmitter 400 and receiver 450 in FIG. 4. Descriptions of these elements are omitted for ease of explanation. In the transmitter 600, the timing dependent $n_b$-sectionized cyclic shift block 605 and the QC-LDPC encoding block 606 are in the same order as shown in FIG. 4. However, in the receiver 650, the QC-LDPC decoding block 562 and the timing dependent $n_b$-sectionized cyclic shift block 563 have switched order.

Thus, in FIG. 6, cyclic shift and QC-LDPC encoding have switched order only in the receiver 650, as compared to FIG. 4. However, in FIG. 5, cyclic shift and QC-LDPC encoding have switched order in both the transmitter 500 and the receiver 550, as compared to FIG. 4. The systems of FIG. 5 and FIG. 6 perform equivalently to the system illustrated in FIG. 4.

With the frame timing (e.g., the two LSBs of the SFN) encoded in the $m_b$-sectionized cyclic shifts of the message (or $n_b$-sectionized cyclic shifts of the output of the QC-LDPC encoder), it is also possible for the receiver to reduce the complexity of PBCH decoding if the receiver attempts soft combining of multiple transmissions of PBCH across multiple frames.

Figure 7:
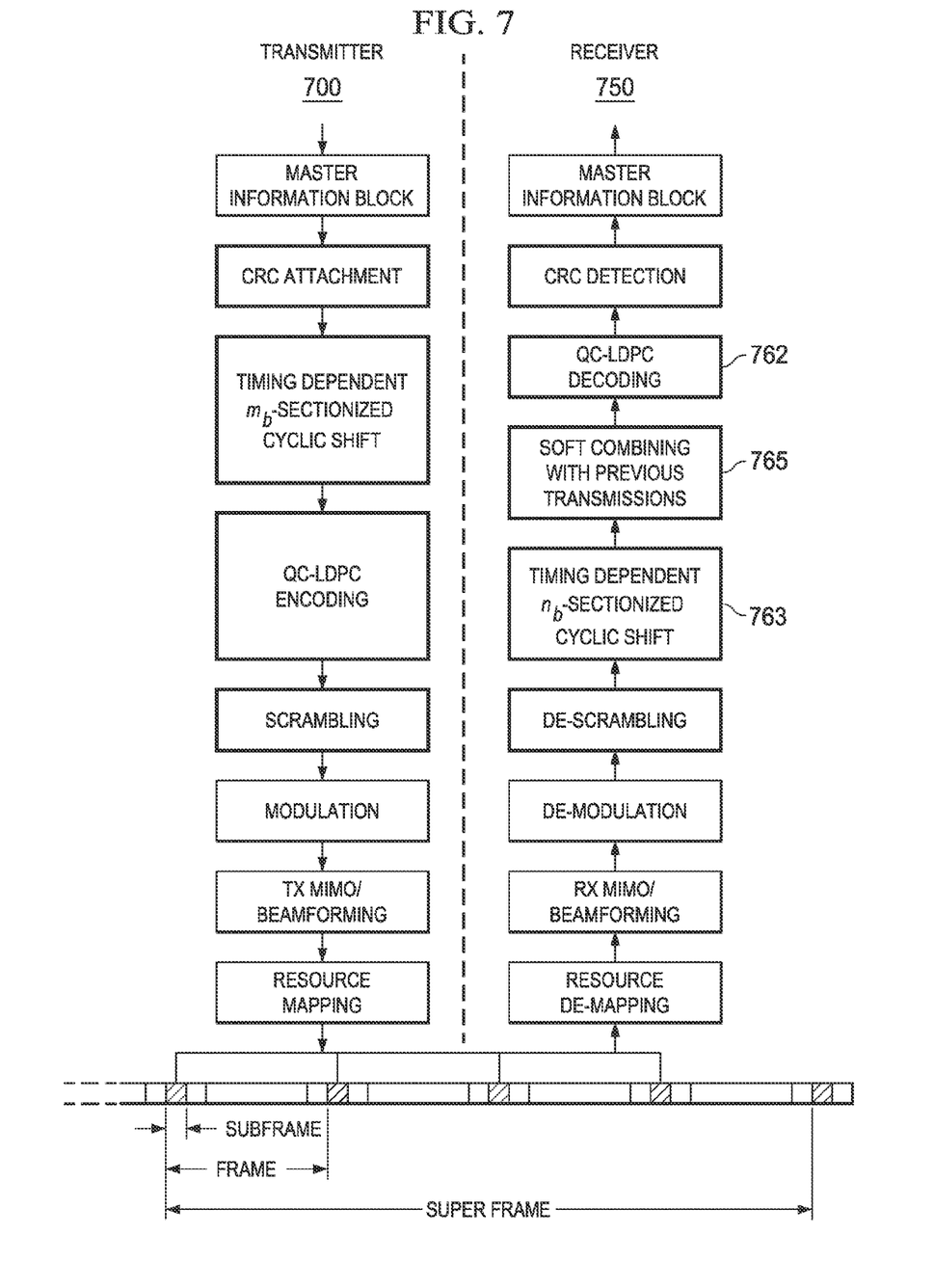
FIG. 7 illustrates soft combining of multiple PBCH transmissions encoded using QC-LDPC with different cyclic shifts, according to one embodiment of the present disclosure.

FIG. 7 illustrates soft combining of multiple PBCH transmissions encoded using QC-LDPC with different cyclic shifts, according to one embodiment of the present disclosure. As shown in FIG. 7, the transmitter 700 and receiver 750 include many of the same or similar elements as the transmitter 400 and receiver 450 in FIG. 4. Descriptions of these elements are omitted for ease of explanation. The receiver 750 includes a QC-LDPC decoding block 762 and a timing dependent $n_b$-sectionized cyclic shift block 763 in a different order than in the receiver 2150. Also, the receiver 750 includes a soft combining block 765.

The receiver 750 does not need the information of frame timing to process a PBCH transmission in the resource de-mapping, Rx MIMO/beamforming processing, de-modulation, and de-scrambling blocks as these blocks are independent of the frame timing information. In the QC-LDPC decoding, the receiver 750 may attempt soft combining with PBCH transmissions in previous frames to increase the reliability of the detection without knowing the frame timing information.

For example, using a hypothesis that the current frame is the third frame in the 40-ms interval (i.e., the value of the two LSBs of the current frame is '10'), the receiver 750 may combine the received symbols in the current frame and the previous two frames as the input to the QC-LDPC decoder 762 because these three frames should carry the same MIB (i.e., PBCH transport block), assuming the hypothesis is correct. Because the de-scrambling and other steps are independent of frame timing, the soft combining may be easily achieved by $n_b$-sectionized cyclically shifting the received symbols to align the received symbols in different transmissions and then combining the aligned received symbols.

Assuming a (384, 48) QC-LDPC code with Z=24 is used, for a message $c_0, c_1, c_2, c_3, \ldots, c_{K-1}$, where K=48, the output of the QC-LDPC encoder is the codeword $d_0, d_1, d_2, d_3, \ldots, d_{N-1}$, where N=384.

In a frame with the value of the two (2) LSBs being '00', the three branches go through further processing such as scrambling, modulation, and so forth, as described earlier.

In a frame with the value of 2 LSBs being '01', the codeword is 16-sectionized cyclically shifted once, resulting in the sequence:

$d_{Z-1}, d_0, d_1, \ldots, d_{Z-2}, d_{2Z-1}, d_Z, d_{Z+1}, \ldots, d_{2Z-2}, \ldots d_{16Z-1}, d_{15Z}, d_{15Z+1}, \ldots, d_{16Z-2}$.

This sequence then proceeds through further processing such as scrambling, modulation, and so forth.

In a frame with the value of 2 LSBs being '10', the codeword is 16-sectionized cyclically shifted two times, resulting in the sequence:

$d_{Z-2}, d_{Z-1}, d_0, d_1, \ldots, d_{Z-3}, d_{2Z-2}, d_{2Z-1}, d_Z, d_{Z+1}, \ldots, d_{2Z-3}, \ldots, d_{16Z-2}, d_{16Z-1}, d_{15Z}, d_{15Z+1}, \ldots, d_{16Z-3}$.

This sequence then proceeds through further processing such as scrambling, modulation, and so forth.

In a frame with the value of 2 LSBs being '11', the codeword is 16-sectionized cyclically shifted three times, resulting in the sequence:

$d_{Z-3}, d_{Z-2}, d_{Z-1}, d_0, d_1, \ldots, d_{Z-4}, d_{2Z-3}, d_{2Z-2}, d_{2Z-1}, d_Z, d_{Z+1}, \ldots, d_{2Z-4}, \ldots, d_{16Z-3}, d_{16Z-2}, d_{16Z-1}, d_{15Z}, d_{15Z+1}, \ldots, d_{16Z-4}$.

This sequence then proceeds through further processing such as scrambling, modulation, and so forth.

The relationship between the $n_b$-sectionized cyclic shift in a frame with the frame timing can be established such that the number of $n_b$-sectionized cyclic shifts in the first frame of a 40 ms interval is zero (0), the number of $n_b$-sectionized cyclic shifts in the second frame of a 40 ms interval is x, the number of $n_b$-sectionized cyclic shifts in the third frame of a 40 ms interval is 2x, and the number of $n_b$-sectionized cyclic shifts in the fourth frame of a 40 ms interval is 3x.

At the receiver side, soft combining can be achieved without knowing the frame timing or the number of cyclic shifts in the current frame. For example, if the receiver is to combine the received symbols of the current frame with the received symbols of the previous frame, the receiver can $n_b$-sectionized cyclically shift the received symbols in the previous frame x times, and then combine the cyclically shifted received symbols in the previous frame with the received symbols in the current frame in the same position. This method of combining achieves the correct combining regardless of the frame timing, as long as the two frames are in the same 40 ms time interval. (It is noted that if the current frame is the first frame of a 40 ms time interval, the receiver should not combine the received symbols in the current frame with the received symbols in any previous frame because they belong to different 40 ms time intervals and thus carry different MIB information bits).

In an embodiment, if the receiver is to combine the received symbols of the current frame with the received symbols of the previous two frames, the receiver can $n_b$-sectionized cyclically shift the received symbols in the previous frame x times, and $n_b$-sectionized cyclically shift the received symbols in the frame before the previous frame 2x times, and then combine the cyclically shifted received symbols in the previous two frames with the received symbols in the current frame in the same position.

The receiver can correctly perform the aforementioned combining without knowing the actual value of the frame timing. In addition, the receiver can perform the combining without applying different descrambling sequences for each hypothesis. These advantages allow significant complexity reduction in the receiver detection of frame timing.

Figure 8:
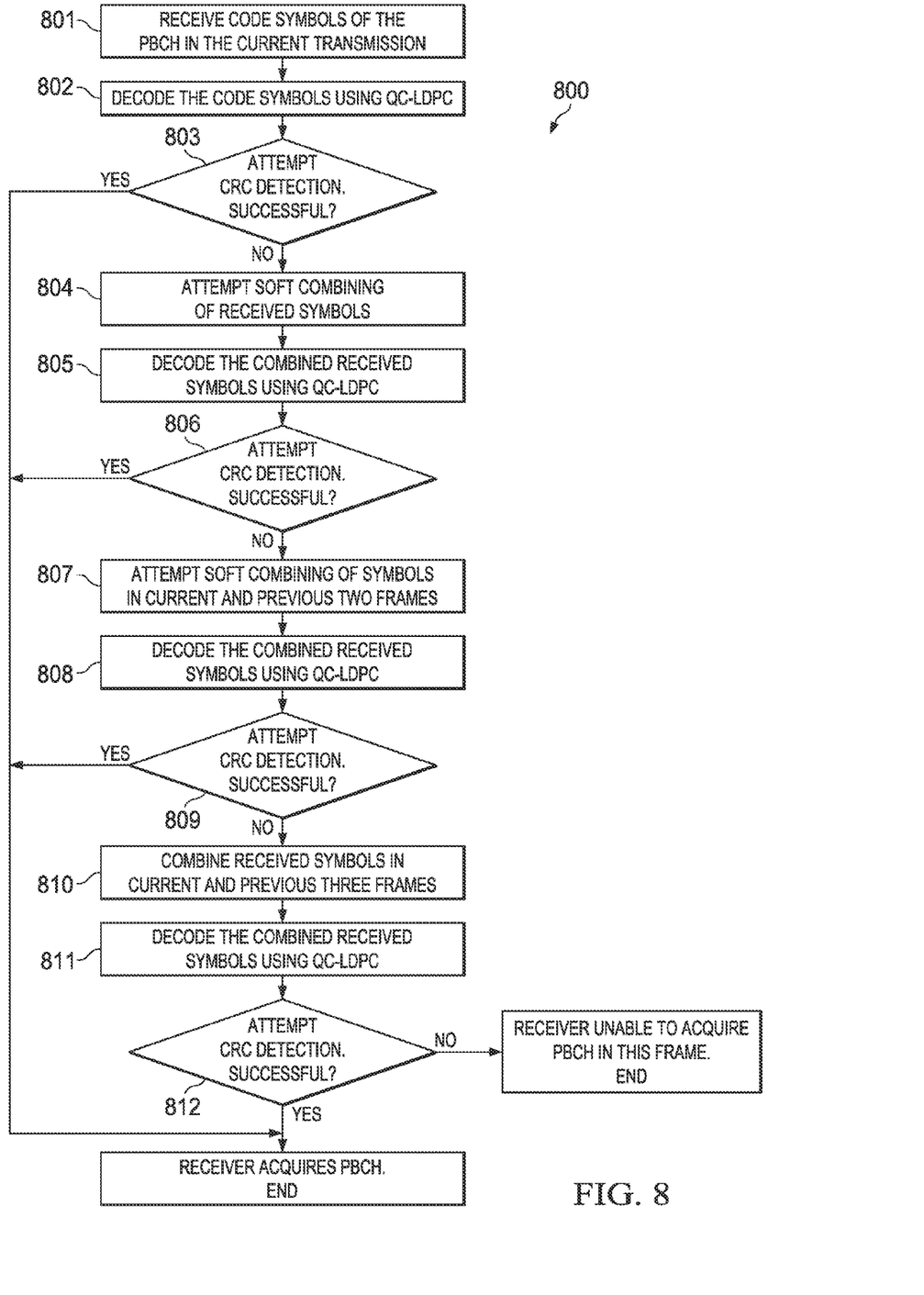
FIG. 8 illustrates a method for a receiver to detect frame timing, according to one embodiment of the present disclosure

FIG. 8 illustrates a method for a receiver to detect the frame timing (and receive the MIB in the PBCH), according to one embodiment of the present disclosure. For ease of explanation, the receiver may represent one or more of the receivers 350-750 in FIGS. 3 through 7, or any other suitable receiver.

The method 800 starts in block 801, where the receiver receives the code symbols of the PBCH in the current transmission (including resource de-mapping, Rx MIMO processing, demodulation, and descrambling). The received symbols may be denoted as D=($d_0$, $d_1$, $d_2$, $d_3$, . . . , $d_{N-1}$).

In block 802, the receiver decodes the received symbols using QC-LDPC. The decoded bits may be denoted as B=($b_0$, $b_1$, $b_2$, $b_3$, . . . $b_{K-1}$).

In block 803, the receiver attempts CRC detection for symbol B, symbol B that has been $n_b$-sectionized cyclically shifted x times, symbol B that has been $n_b$-sectionized cyclically shifted 2x times, and symbol B that has been $n_b$-sectionized cyclically shifted 3x times in order to detect the frame timing. If the CRC checks for B, the current frame is the first frame of a 40 ms time interval. If the CRC checks for symbol B that has been $n_b$-sectionized cyclically shifted x times, the current frame is the second frame of a 40 ms time interval. If the CRC checks for symbol B that has been $n_b$-sectionized cyclically shifted 2x times, the current frame is the third frame of a 40 ms time interval. If the CRC checks for symbol B that has been $n_b$-sectionized cyclically shifted 3x times, the current frame is the fourth frame of a 40 ms time interval. If the CRC does not check for any of the four hypotheses, the method proceeds to block 804.

In block 804, the receiver attempts soft combining of the received symbols in the current frame with the received symbols in the previous frame. The receiver may use the following soft combining process:

Part A: Denote the received symbols in the previous frame (after resource de-mapping, Rx MIMO processing, demodulation, descrambling) as D'.

Part B: The receiver $n_b$-sectionized cyclically shifts D' by x times.

Part C: The receiver adds the results obtained in Part B with the received symbols in the current frame. The addition is applied to the two symbols in the same position.

In block 805, the receiver decodes the combined received symbols using QC-LDPC. The decoded bits may be denoted as B'.

In block 806, the receiver attempts CRC detection of symbol B' that has been $n_b$-sectionized cyclically shifted x times, symbol B' that has been $n_b$-sectionized cyclically shifted 2x times, and symbol B' that has been $n_b$-sectionized cyclically shifted 3x times to detect the frame timing. If the CRC checks for symbol B' that has been $n_b$-sectionized cyclically shifted x times, the current frame is the second frame of a 40 ms time interval. If the CRC checks for symbol B' that has been $n_b$-sectionized cyclically shifted 2x times, the current frame is the third frame of a 40 ms time interval. If the CRC checks for symbol B' that has been $n_b$-sectionized cyclically shifted 3x times, the current frame is the fourth frame of a 40 ms time interval. If the CRC does not check for any of the three hypotheses, the method proceeds to block 807.

In block 807, the receiver attempts soft combining of the received symbols in the current frame with the received symbols in the previous two (2) frames. The receiver may use the following soft combining process:

Part A: Denote the received symbols in the frame before the previous frame (after resource de-mapping, Rx MIMO processing, demodulation, descrambling) as D".

Part B: The receiver $n_b$-sectionized cyclically shifts D" by x times.

Part C: The receiver adds the results obtained in block 804 Part B, block 807 Part B, and the received symbols in the current frame. The addition is applied to the symbols in the same position.

In block 808, the receiver decodes the combined received symbols using QC-LDPC. The decoded bits may be denoted as B".

In block 809, the receiver attempts CRC detection for symbol B" that has been $n_b$-sectionized cyclically shifted 2x times and symbol B" that has been $n_b$-sectionized cyclically shifted 3x times to detect the frame timing. If the CRC checks for symbol B" that has been $n_b$-sectionized cyclically shifted 2x times, the current frame is the third frame of a 40 ms time interval. If the CRC checks for symbol B" that has been $n_b$-sectionized cyclically shifted 3x times, the current frame is the fourth frame of a 40 ms time interval. If CRC does not check for either of the two hypotheses, the method proceeds to block 810.

In block 810, the receiver combines the received symbols in the current frame with the received symbols in the previous three (3) frames. The receiver may use the following soft combining process:

Part A: Denote the received symbols in the frame before the previous frame (after resource de-mapping, Rx MIMO processing, demodulation, descrambling) as D'''.

Part B: The receiver $n_b$-sectionized cyclically shifts D''' by x times.

Part C: The receiver adds the results obtained in block 810 Part B, block 807 Part B, block 804 Part B, and the received symbols in the current frame. The addition is applied to the symbols in the same position.

In step 811, the receiver decodes the combined received symbols using QC-LDPC. The decoded bits may be denoted as B'''. This block is similar to block 805 and 808.

In step 812, the receiver attempts CRC detection for symbol B''' that has been $n_b$-sectionized cyclically shifted 3x times to detect the frame timing. If the CRC checks for symbol B''' that has been $n_b$-sectionized cyclically shifted 3x times, the current frame is the fourth frame of a 40 ms time interval. If the CRC does not check, the receiver is not able to acquire PBCH in this frame. The receiver may save the received symbols in this frame and wait for a new PBCH transmission in the next frame.

Although FIG. 8 illustrates one example of a method 800 for detecting frame timing, various changes may be made to FIG. 8. For example, although the method 800 is described using an example where the number of cyclic shifts in the first frame of a 40 ms interval is zero (0), the number of cyclic shifts in the second frame of a 40 ms interval is x, the number of cyclic shifts in the third frame of a 40 ms interval is 2x, and the number of cyclic shifts in the fourth frame of a 40 ms interval is 3x, different mappings between the number of cyclic shifts and the frame timing may be used (e.g., 1, x+1, 2x+1, 3x+1).

As another example, in blocks 803, 806, and 809, the receiver may only attempt CRC detection for one hypothesis of cyclic shift.

As yet another example, the soft combining with previous frames can be optimized by storing some of the values that have been calculated in block 804 for use in block 807, and by storing some of the values that have been calculated in block 807 for use in block 810. The soft combining with previous frames in blocks 804, 807, and 810 can be further optimized by storing some of the values that have been calculated in previous frames to further reduce computational complexity.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. For use in a wireless network, a transmitter configured to encode information, the transmitter comprising:
    a cyclic redundancy check (CRC) encoder configured to encode a physical broadcast channel (PBCH) message using a cyclic redundancy check;
    a timing dependent cyclic shift block configured to encode information in the PBCH message; and
    a quasi-cyclic low-density parity-check (QC-LDPC) encoder configured to encode the PBCH message using a QC-LDPC code.

2. The transmitter of claim 1, wherein the timing dependent cyclic shift block is configured to encode the information in the PBCH message by cyclically shifting a plurality of bits in the PBCH message a predetermined number of times, the predetermined number corresponding to a value of the information in the PBCH message.

3. The transmitter of claim 2, wherein the PBCH message is divided into $m_b$ sections, each section having a same number of bits, and wherein the timing dependent cyclic shift block cyclically shifts using $m_b$-sectionized cyclically shifting.

4. The transmitter of claim 3, wherein the timing dependent cyclic shift block $m_b$-sectionized cyclically shifts a predetermined number of times.

5. The transmitter of claim 2, wherein the value of the information in the PBCH message is determined from a final two bits of a system frame number (SFN) of a frame.

6. The transmitter of claim 5, wherein the information in the PBCH message comprises frame timing information.

7. The transmitter of claim 1, wherein the timing dependent cyclic shift block encodes the information in the PBCH message and then the QC-LDPC encoder encodes the PBCH message using the QC-LDPC code.

8. The transmitter of claim 1, wherein the QC-LDPC encoder encodes the PBCH message using the QC-LDPC code before the timing dependent cyclic shift block encodes the information in the PBCH message.

9. The transmitter of claim 1, wherein the information in the PBCH message is encoded such that the information can be detected by a receiver either after or before QC-LDPC decoding of the PBCH message.

10. For use in a wireless network, a method of encoding information at a transmitter, the method comprising:
    encoding a physical broadcast channel (PBCH) message using a cyclic redundancy check (CRC);
    encoding information in the PBCH message; and
    encoding the PBCH message using a quasi-cyclic low-density parity-check (QC-LDPC) code.

11. The method of claim 10, wherein encoding the information in the PBCH message comprises cyclically shifting a plurality of bits in the PBCH message a predetermined number of times, the predetermined number corresponding to a value of the information in the PBCH message.

12. The method of claim 11, wherein the PBCH message is divided into $m_b$ sections, each section having a same number of bits, and wherein cyclically shifting comprises $m_b$-sectionized cyclically shifting.

13. The method of claim 12, wherein $m_b$-sectionized cyclically shifting comprises $m_b$-sectionized cyclically shifting a predetermined number of times.

14. The method of claim 10, wherein the value of the information in the PBCH message is determined from a final two bits of a system frame number (SFN) of a frame.

15. The method of claim 14, wherein the information in the PBCH message comprises frame timing information.

16. The method of claim 10, wherein the encoding of the information in the PBCH message is performed before the encoding of the PBCH message using the QC-LDPC code.

17. The method of claim 10, wherein the encoding of the PBCH message using the QC-LDPC code is performed before the encoding of the information in the PBCH message.

18. The method of claim 10, wherein the information in the PBCH message is encoded such that the information can be detected by a receiver either after or before QC-LDPC decoding of the PBCH message.

19. For use in a wireless communication network, a method of detecting frame timing at a receiver, the method comprising:
    receiving code symbols of a physical broadcast channel (PBCH) in a message;
    decoding the received code symbols using a quasi-cyclic low-density parity-check (QC-LDPC) code;
    examining the QC-LDPC-decoded symbols for a cyclic redundancy check (CRC);
    $m_b$-sectionized cyclically shifting the QC-LDPC-decoded symbols; and
    determining a current frame number based on a number of times the QC-LDPC-decoded symbols are cyclically shifted.

20. The method of claim 19, further comprising:
    soft combining the received code symbols of a current frame with the received code symbols of at least one previous frame.

21. The method of claim 20, further comprising:
    repeating the examining, $m_b$-sectionized cyclically shifting, and soft combining steps until a CRC check is established.

22. The method of claim 19, wherein $m_b$-sectionized cyclically shifting comprises $m_b$-sectionized cyclically shifting a predetermined number of times.

* * * * *